(12) United States Patent
Van Den Brink (10) Patent No.: US 10,079,999 B2
(45) Date of Patent: Sep. 18, 2018

(54) VIDEO SURVEILLANCE FOR MRI SAFETY MONINTORING

(71) Applicant: KONINKLIJKE PHILIPS N.V., Eindhoven (NL)

(72) Inventor: Johan Samuel Van Den Brink, Best (NL)

(73) Assignee: Koninklijke Philips N.V., Eindhoven (NL)

(*) Notice: Subject to any disclaimer, the term of this patent is extended or adjusted under 35 U.S.C. 154(b) by 168 days.

(21) Appl. No.: 15/035,245

(22) PCT Filed: Oct. 23, 2014

(86) PCT No.: PCT/IB2014/065556
§ 371 (c)(1),
(2) Date: May 9, 2016

(87) PCT Pub. No.: WO2015/071796
PCT Pub. Date: May 21, 2015

(65) Prior Publication Data
US 2016/0295171 A1 Oct. 6, 2016

Related U.S. Application Data

(60) Provisional application No. 61/905,357, filed on Nov. 18, 2013.

(51) Int. Cl.
*H04N 7/18* (2006.01)
*G06K 9/00* (2006.01)
*G06T 7/70* (2017.01)

(52) U.S. Cl.
CPC ......... *H04N 7/181* (2013.01); *G06K 9/00771* (2013.01); *G06T 7/70* (2017.01)

(58) Field of Classification Search
CPC . H04N 7/18; H04N 7/181; G06T 7/00; G06T 7/70; G06T 7/004; G06K 9/00; G06K 9/00771
(Continued)

(56) References Cited

U.S. PATENT DOCUMENTS 7,352,180 B2 4/2008 Manneschi
7,696,751 B2 4/2010 Molyneaux et al.
(Continued)

FOREIGN PATENT DOCUMENTS

| GB | 2395276 A | 5/2004 |
|---|---|---|
| WO | 03088157 A1 | 10/2003 |
| WO | 2012022971 A2 | 2/2012 |

OTHER PUBLICATIONS

Kanan et al ACR Guidance Document for Safe MR Practices 2007, AJR 188, Jun. 2007 p. 127.

*Primary Examiner* — Thai Tran
*Assistant Examiner* — Nien-Ru Yang (57) ABSTRACT

A magnetic resonance imaging (MRI) location surveillance system (10) for determining access to a room (12) containing an MRI device (14) which includes a superconducting magnet and images subjects includes at least one video camera (26) positioned to view an entrance (26) to the room containing the MRI device (14), a recognize unit (36) in communication with the at least one video camera, a classify unit (37), and an authorize unit (38). The at least one video camera (26) images objects and persons approaching the entrance (16). The recognize unit (36) receives the imaged objects and persons, and recognizes each imaged object and each imaged person. The classify unit (37) classifies each recognized object (24) and each recognized person (22) according to MRI safety. The authorize unit (38) determines
(Continued)

access to the room (14) containing the MRI device (14) based on each classified object and each classified person.

13 Claims, 5 Drawing Sheets

(58) Field of Classification Search
USPC .......................................................... 348/159
See application file for complete search history.

(56) References Cited

U.S. PATENT DOCUMENTS

| | | |
|---|---|---|
| 2003/0171669 A1 | 9/2003 | Kopp |
| 2004/0017929 A1* | 1/2004 | Bramblet ................. G07C 9/00 |
| | | 382/103 |
| 2005/0225327 A1 | 10/2005 | Maschke |
| 2005/0228258 A1 | 10/2005 | Maschke |
| 2007/0057786 A1* | 3/2007 | McClure ................ G01R 33/28 |
| | | 340/551 |
| 2009/0167307 A1 | 7/2009 | Kopp |
| 2010/0059679 A1 | 3/2010 | Albrecht |

\* cited by examiner

VIDEO SURVEILLANCE FOR MRI SAFETY MONINTORING

CROSS REFERENCE TO RELATED APPLICATIONS

This application is a U.S. national phase application of International Application No. PCT/IB2014/065556, filed on Oct. 23, 2014, which claims the benefit of U.S. Provisional Application Ser. No. 61/905,357 filed on Nov. 18, 2013 and is incorporated herein by reference.

The following relates generally to safety at medical facilities. It finds particular application in conjunction with patient and healthcare worker safety monitoring and access control for magnetic resonance imaging devices, and will be described with particular reference thereto. However, it will be understood that it also finds application in other usage scenarios and is not necessarily limited to the aforementioned application.

Magnetic resonance imaging (MRI) employs devices with very powerful magnets. The MRI devices are placed in a room which is typically shielded to isolate a strong static magnetic field. Patients undergoing a MRI procedure are asked to remove all metal, particularly ferrous metal, objects from their person such as watches, rings, etc. when dressing for the procedure. Safety guidelines have been issued by accrediting agencies such as the American College of Radiology (ACR).

The power of the MRI magnets used can turn ordinary ferrous objects into projectiles. Care must be used in bringing equipment or other objects into a MRI room. Objects which include ferrous metals can become projectiles which are dangerous to patients, healthcare practitioners, and other persons present. Common hospital equipment such as oxygen tanks, respirators, and the like, can be made of materials which are non-magnetic or magnetic resonance (MR) safe. To an untrained person, the MR safe equipment often looks like a corresponding common MR unsafe magnetic version. Examples can be found in the media and on the Internet where equipment susceptible to magnetic fields was taken into the MRI room and became a projectile. Examples of large objects being drawn toward an isocenter of the magnet include chairs, gurneys, floor buffers, oxygen tanks, acetylene tanks, etc., may anchor themselves across the opening to the bore. Smaller objects such as paper clips, pens, stethoscopes, etc. can be drawn into the bore to the isocenter and also become dangerous projectiles as well. MRI accidents with projectiles have been increasing and fatalities have been recorded.

One approach to reduce the safety hazard has been to install a Ferrous Metal Detector (FMD) around the entrance to the MRI room. As a person passes through the doorway, the person is scanned and if magnetic objects are detected, an alarm is sounded or lights flashed. However, the MRI device is typically footsteps away from the entrance and by the time the alarms sounds and the person reacts, it is often too late.

An idealized suite presented by the ACR illustrates a funnel concept which gradually restricts patient flow to a point where a trained healthcare professional visually monitors the entrance and approach to the entrance of the MRI room. The guidelines recommend a trained healthcare professional visually monitor the entrance to the MRI room. However, MRI rooms have been implemented over time and in locations world-wide which can include room configurations where visual monitoring of the entrance is impractical. Control rooms are adjacent with windows between the control room and the MRI room for the operator to view the subject during the imaging procedure. Some MRI rooms are located off common access corridors or hallways with personnel in a control room and have separate entrances.

Flow into the MRI room is difficult to control. Untrained persons in some situations accompany and assist patients. In some cultures, family members expect to accompany and assist patients. Additionally, stresses of medical situations, cost considerations, and the variety of tasks to be performed can include lapses in one person's memory or attention focused elsewhere rather than on potential MRI hazards at any one point in time.

The following discloses a new and improved video surveillance for MRI safety monitoring which addresses the above referenced issues, and others.

In accordance with one aspect, a magnetic resonance imaging (MRI) location surveillance system for determining access to a room containing an MRI device which includes a main, preferably superconducting, magnet and images subjects includes at least one video camera positioned to view an entrance to the room containing the MRI device, a recognize unit in communication with the at least one video camera, a classify unit, and an authorize unit. The at least one video camera images objects and persons approaching the entrance. The recognize unit receives the imaged objects and persons, and recognizes each imaged object and each imaged person. The classify unit classifies each recognized object and each recognized person according to MRI safety. The authorize unit determines access to the room containing the MRI device based on each classified object and each classified person. In more detail, the MR device is configured to generate magnetic resonance signals from an object to be imaged, acquire the magnetic resonance signals and reconstruct magnetic resonance images from the acquired magnetic resonance signals, so as to image the object. The object may be a patient to be examined and the images are diagnostic magnetic resonance images.

In accordance with another aspect, a method of video surveillance includes receiving video images of persons and objects approaching an entrance to a room containing a magnetic resonance imaging (MRI) device which includes a superconducting magnet and images subjects. Each imaged object and each imaged person are recognized. Each recognized object and each recognized person are classified according to MRI safety. Access to the room containing the MRI device is determined based on each classified object and each classified person.

In accordance with another aspect, a magnetic resonance imaging (MRI) location surveillance system includes a room containing an MRI device, at least one video camera positioned to view an entrance to the room containing the MRI device, one or more visual and/or audio indicators, an electronic locking mechanism, and a computer in communication with the at least one video camera, the one or more visual and/or audio indicators, and the electronic locking mechanism. The room includes a superconducting magnet and images subjects. The at least one video camera images objects and persons approaching the entrance. The one or more visual and/or audio indicators provide at least one type of visual and/or audio indication regarding MRI safety. The electronic locking mechanism controls physical access of persons and objects to the room containing the MRI device. The computer is programmed to receive the imaged objects and persons, recognize each imaged object and each imaged person, and for each recognized imaged object recognize labeling, and classify each recognized object and label and each recognized person according to MRI safety. The computer is further programmed to determine access to the room containing the MRI device based on all the classified objects and all the classified persons, and communicate the determined access to the one or more visual and/or audio indicators, and the electronic locking mechanism.

One advantage is an increase in safety of patients, healthcare practitioners, and others accompanying patients in the MRI room.

Another advantage resides in reduced dependence on visual monitoring of the MR room entrance by a responsible healthcare practitioner.

Another advantage resides in graduated surveillance of persons and objects approaching the MR room.

Another advantage resides in the adaptability to wide variety of physical locations.

Another advantage resides in the adaptability to wide variety of local practices and workflows.

Still further advantages will be appreciated to those of ordinary skill in the art upon reading and understanding the following detailed description.

The invention may take form in various components and arrangements of components, and in various steps and arrangement of steps. The drawings are only for purposes of illustrating the preferred embodiments and are not to be construed as limiting the invention.

A further implementation of the invention involves determining access which includes: communicating with one or more visual indicators to visually indicate and one or more audio indicators to audibly indicate the determined access for classified persons and objects.

A further implementation of the invention involves storing video of objects classified as MRI unsafe in a corresponding distance to the entrance with persons simultaneously classified as MRI safe.

A further implementation of the invention involves carrying software which controls one or more electronic data processing devices to perform the method according to this implementation.

An electronic data processing device is according to an aspect of the invention configured to perform the method of the invention.

A magnetic resonance imaging (MRI) location surveillance arrangement of the invention, comprising:
  a room containing an MRI device which includes a main magnet and images subjects;
  at least one video camera positioned to view an entrance to the room containing the MRI device which images objects and persons approaching the entrance;
  one or more visual indicators and/or audio indicators which provide at least one type of visual and/or audible indication regarding MRI safety;
  an electronic locking mechanism which controls physical access of persons and objects to the room containing the MRI device; and
  a computer in communication with the at least one video camera, the one or more visual and/or audio indicators, and the electronic locking mechanism, and programmed to:
    receive the imaged objects and persons;
    recognize each imaged object and each imaged person, and for each recognized imaged object recognize labeling;
    classify each recognized object and label and each recognized person according to MRI safety; and
    determine access to the room containing the MRI device based on all the classified objects and all the classified persons; and
    communicate to the one or more visual and/or audio indicators, and the electronic locking mechanism the determined access.

Figure 1:
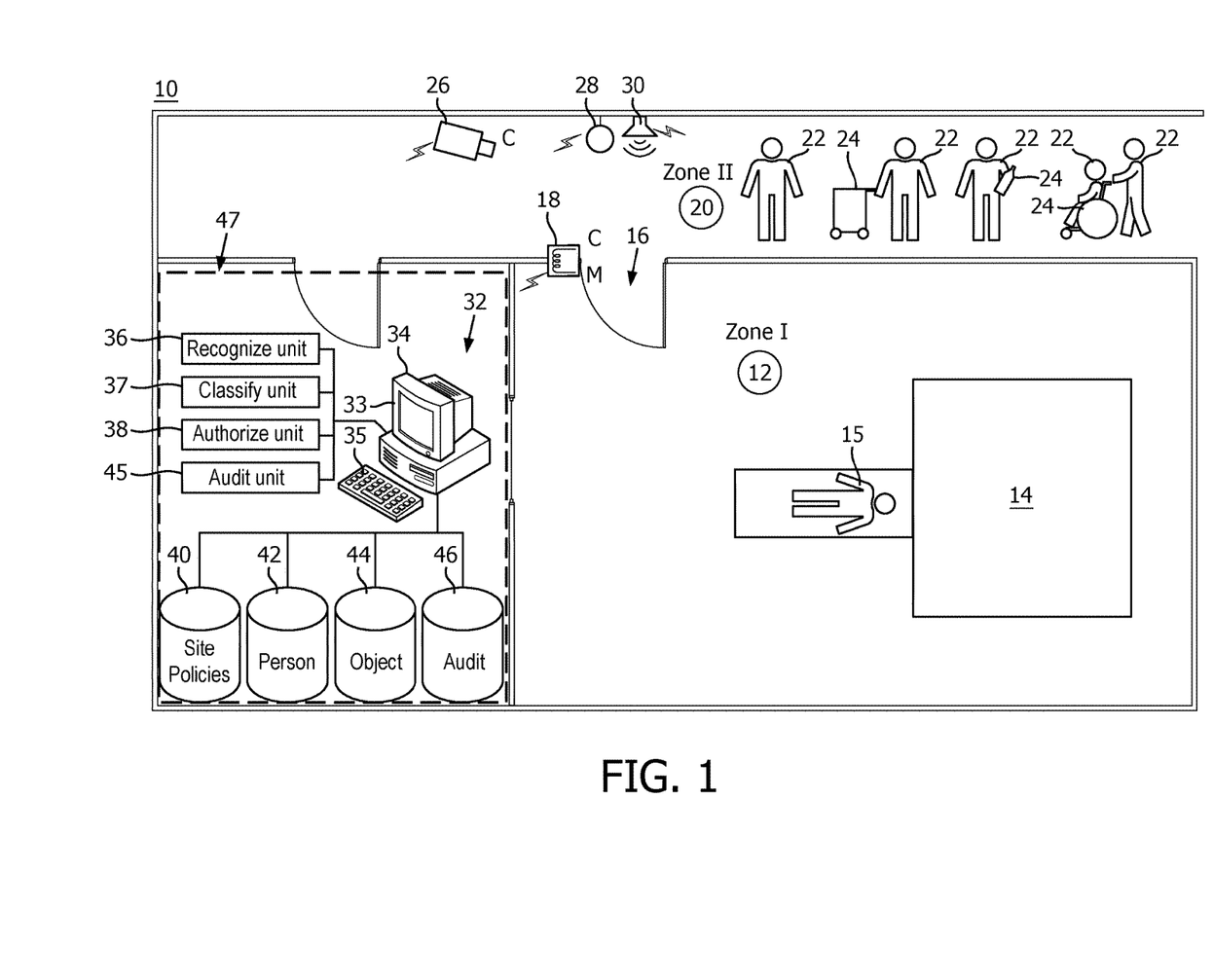
FIG. 1 schematically illustrates an embodiment of a video surveillance for MRI safety monitoring system.

With reference to FIG. 1, an embodiment of a video surveillance system 10 for MRI safety monitoring is schematically illustrated. A room 12 contains an MRI device 14 which includes a superconducting magnet and images subjects 15. Access to the room is through an entrance 16 which includes a controlled doorway with an electronic locking mechanism 18. The electronic locking mechanism releases when access is granted, which permits the door to be opened by a person or a door operating mechanism. Persons who include patients, healthcare practitioners, persons accompanying patients, and other visitors approach the entrance 16 through a location or outer zone 20, which can include a hallway, outer room, corridor, and the like. One or more persons 22 approach the entrance 16. The persons approaching the entrance can carry, push, drag, or be otherwise accompanied by objects 24.

At least one video camera 26 is positioned in the outer zone to view the entrance to the room containing the MRI device which images objects 24 and persons 22 approaching the entrance 16. One or more visual indicators 28 provide a visual indication of authorized persons and/or authorized objects and/or authorized persons or objects according to MRI safety guidelines. The visual indicators 28 can be positioned near the entrance, around the entrance, or on the entrance. For example, strip lighting can be around the door jamb and display yellow, green, or red lights. Green can indicate MR safe and access granted. Yellow can indicate MR caution and access granted, but with warning. Red can indicate MR unsafe and access denied. The visual indicators can include color indicators, sequence indicators, or intensity indicators. For example, constant low intensity green can indicate MR safe while red, high intensity, flashing can indicate MR unsafe. One or more audio indicators 30 can provide an audible indicator of the authorized persons and objects. The audible indicators can include different sounds, which can vary in intensity, timing, and pitch. The audible indicators can provide verbal feedback such as verbal statements or instructions. For example, an alarm sound of short duration three times can precede a verbal statement delivered "unauthorized MR object detected, please show approved label". The visual indicators and audio indicators provide two different modes of communication to persons approaching the entrance.

The video camera(s), visual indicator(s), and audio indicator(s) are communicatively connected to at least one computer 32. The communication can be wired or wireless. The computer includes a processor 33, a display device 34, and one or more input devices 35. The computer can be locally located as depicted in a control room for the MRI scanner, or remotely located and connected via a network.

The computer can be a server, a server and a local computer, or combination of server and local computers connected through the network.

The computer 32 is programmed with a recognition unit or routine 36 which receives the video images of objects and persons and recognizes each imaged object and person. The recognition unit can recognize based on a video frame or frame interval, or recognize and track through a sequence of frames. Person recognition can include facial recognition, pedestrian recognition, skin recognition, clothing recognition, and the like. Object recognition can include shape recognition, texture recognition, edge detection, label recognition, and the like. Recognition can include comparison with person or object features stored in a database. For example, the recognized facial features of a person from the video image can be compared with stored facial features associated with each trained person. The recognition unit can display real-time video of the imaged objects and/or persons and recognition information. For example, persons and objects can be outlined in the video image as they are recognized.

A classify unit 37 classifies each recognized object and person according to MRI safety. Persons can be classified based on persons and person classes stored in a person data store 42. The classify unit 37 connects to the person data store. For example the data store can include information of persons such as MRI safety training or certification, level of safety training or type of training, and the like. A person recognized by the recognize unit 36 and matched with an identity in the data store is assigned to a class of trained persons. Recognized by the recognize unit and not matched with an identity can be classified by the classify unit 37 as unknown, visitor, or untrained and corresponding access rule defined for the class. The classify unit 37 classifies objects based on object recognition and object classes store in an object data store 44. For example, objects can be recognized and matched with objects in a data store of objects, which can include classes of MR safe, MR unsafe, and unknown. For example, an object recognized as a ventilator can be classified as MR unsafe. Unknown can be defined as a subclass of MR unsafe or a separate class according to site policies. The classify unit 37 can display on the display device 33 overlays which indicate classified persons and/or objects. For example, the recognized persons or objects can be outlined in different colors and/or shaded to indicate the classification such MR safe, MR unsafe, etc.

An authorize unit 38 determines access to the room containing the MRI device based on each classified object and person. The authorize unit 38 determines access which includes a determination of distance and direction of movement of classified objects and persons relative to the entrance. For example, with multiple persons in proximity to the entrance, the authorize unit can identify those moving away and those moving toward, and determine from the crowd based on distance and direction, the appropriate access according to the site policies. The authorize unit can order persons approaching the entrance according to a distance to the entrance of the room. The authorize unit determines a distance between persons differently classified, and then determines access based on the determined distance. In another example, a trained person at the front of a group moving toward the room can be granted access while only a trained person in the rear of the group can deny access until the trained person moves to the front of the group.

The authorize unit 38 and the classify unit 37 connect to a data store of site policies 39 which define a hierarchy of object classes and person classes and corresponding access privileges. The authorize unit 38 associate classified objects with object classes and classified persons with person classes. Access can be determined based on an evaluation of the hierarchy of associated objects and persons and the corresponding access privileges.

For example, a locally defined hierarchy includes the ordered rules: 1) unauthorized object, deny; 2) trained person, grant; 3) untrained person, warn. Persons and objects are classified. For any person or persons accompanied by an unauthorized object, the example hierarchy evaluates to deny access. If no unauthorized object is present, then the example hierarchy evaluates to access granted if a trained person is present. If no unauthorized object is present and no trained person is present, then the example hierarchy evaluates to a warning to the untrained person. The warning can be locally defined to deny access, or grant access and provide visual and/or audible warning or instructions. Another example hierarchy includes unknown classifications: 1) unauthorized object, deny; 2) trained person, grant; 3) unknown object, deny; 4) untrained person, grant. In a situation with the example hierarchy where a trained person is present and no unauthorized object is present, access is granted. However, in the situation using the example hierarchy where only an untrained person with an unknown object is present, access is denied, and if no objects are present, then access can be granted to the untrained person. The permissions of each rule in the hierarchy can be locally defined according to the site policies.

An audit unit 45 can store in an audit data store 46 the video of objects persons, recognition information, classification information, and determined access information corresponding to the stored video. The stored video and information can be analyzed to improve safety procedures. The audit unit 45 can store in the audit data store 46 the video of objects classified as MRI unsafe in a corresponding distance to the entrance with persons simultaneously classified as MRI safe. For example, a record can be kept of objects for which attempts can be made to bring them into the MR room. Instructions to persons approaching the room can be modified based on a sampling of the recorded objects, to advise them that, for example, the unsafe object cannot be brought into the MR room and that it should be left behind.

The various units or routine 36, 37, 38, 45 are suitably embodied by an electronic data processing device, such as the electronic processor or electronic processing device 33 of the computer 32, or by a network-based server computer operatively connected with the computer 32 by a network, or so forth. Moreover, the disclosed recognition, classification, authorization, and audit techniques are suitably implemented using a non-transitory storage medium storing instructions (e.g., software) readable by an electronic data processing device and executable by the electronic data processing device to perform the disclosed recognition, classification, authorization, and audit techniques.

The data stores 40, 42, 44 can include files and file systems and/or elements and databases. Databases can be object, relational, or combinations. Data can be stored in structure formats, semi-structured formats, or object formats. The data can include alphanumeric data, images, reference material referenced by the different recognition algorithms. The data can include employee and/or training records by linked or direct storage. The data stores can be stored on different storage mediums and locations. For example, the data stores can be network attached storage, local disk, server storage, and/or cloud storage.

Figure 2:
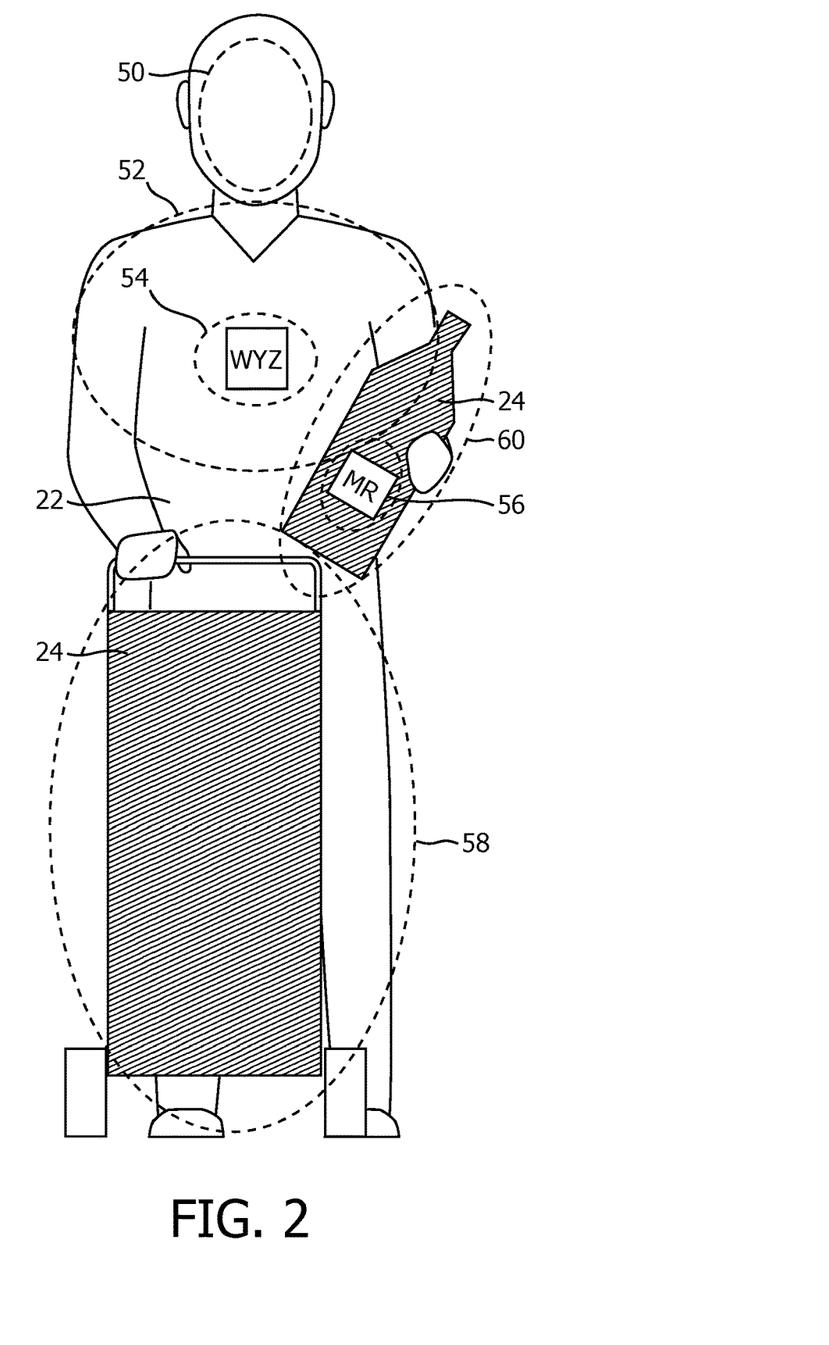
FIG. 2 diagrammatically illustrates an exemplary of surveillance and classification.

With reference to FIG. 2, an exemplary of surveillance and classification is diagrammatically illustrated of a person 22 and objects 24. The person is recognized by recognize unit 36 based on shape, movement, color, and/or texture. Recognition can occur through one or more algorithms based on facial recognition, clothing recognition, badge recognition, or symbol recognition. Facial recognition recognizes features of a face 50 of the person. Clothing recognition recognizes textiles 52 or clothing materials worn by the person, such as a uniform. Clothing recognition can include recognizing a symbol worn on or displayed the clothing. Badge recognition recognizes aspects of a badge 54 or ID worn or displayed by the person, e.g. shape and edge detection. Badges can include features such as barcodes, pictures, or symbols unique to a location and/or person which are further recognized by the computer. Recognition is of the person individually or as a group member. For example, a person is recognized wearing a uniform which conforms to the site policy, is recognized as an employee. Recognition can further recognize the person such as facial recognition which matches the face in the video image to a face of a person stored in the person data store having a name and other attributes, e.g. John Smith.

Classification by the classify unit 37 includes classifying the person in one class such as "MR safe", "MR unsafe", "MR warn", "Unknown", etc. Classes can be further divided or separated for ease of administration. For example, the MR safe class can include a subclass of trained employees and also include individually designated persons such as contract MR technicians. Classification includes matching the recognized person to a person class. For example, a person recognized wearing an MR employee uniform is classified as MR safe while a person recognized wearing a generic type employee uniform maybe classified as MR unsafe. In another example, a person recognized as John Smith can be classified based on attributes retrieved from the person data store which specify MR safe or MR trained as a subclass of MR safe for John Smith.

Determining access by the authorize unit 38 is based on the assigned class. The class of employees can be granted access according to the site policies data store 40. For example, trained employees can be granted access based on granted access determined for the class trained employees. Persons classified as trained employees can be individually recognized, e.g. facial recognition, badge number, etc. or recognized as members, e.g. uniform, symbol, etc. Trained employees can be a subclass of MR safe and inherent the granted access from the class MR safe. In another example, untrained employees can be granted access with warning, which corresponds to a class determined with access granted and warnings visually indicated. The authorize unit 38 determines the indicator configurations of the visual and audio indicators based on the determined access.

Object 24 recognition by the recognize unit 36 can further include label 56 recognition located on each recognized imaged object. Object recognition recognizes objects such as oxygen tanks, wheelchairs, ventilators, etc. Label recognition recognizes labels affixed or attached to the objects such as an MR safe symbol. An example of the MR safe symbol includes the letters MR within a square and color coded green. The recognized label can alternatively or additionally include a barcode, serial number, or other visually readable code which can be linked to attributes of MR safety. The label can be an industry, tradegroup, medical association, etc. designated label for MR safe equipment. The classify unit classifies objects based on the recognized object and if present, the recognized object label. Each object is recognized and classified. For example, a first object 58 such as a ventilator is recognized as a ventilator and classified as MR unsafe. No label is recognized. Determined access for MR unsafe objects is to deny access to the MRI room. In another example, a second object 60 is present such as an oxygen tank which is classified as MR unsafe. However, with the label 56 visible and recognized, the second object is reclassified as MR safe. In a combine example with the first object 58 present and classified as MR unsafe and the second object 60 present with the recognized label and classified as MR safe, access can determined based on an evaluation of the assigned hierarchy of MR unsafe objects and MR safe objects. The hierarchy of the examples described in reference to FIG. 1, presence of any unsafe MR objects evaluates to deny access for the combined presence of both objects. Based on the label or other evaluations, a determination may be made that the object can enter the MR room, but must be kept at least a minimum distance always from the magnet, e.g. outside of the 5 gauss line. An appropriate warning of the limited access is generated acoustically and/or visually.

Figure 3:
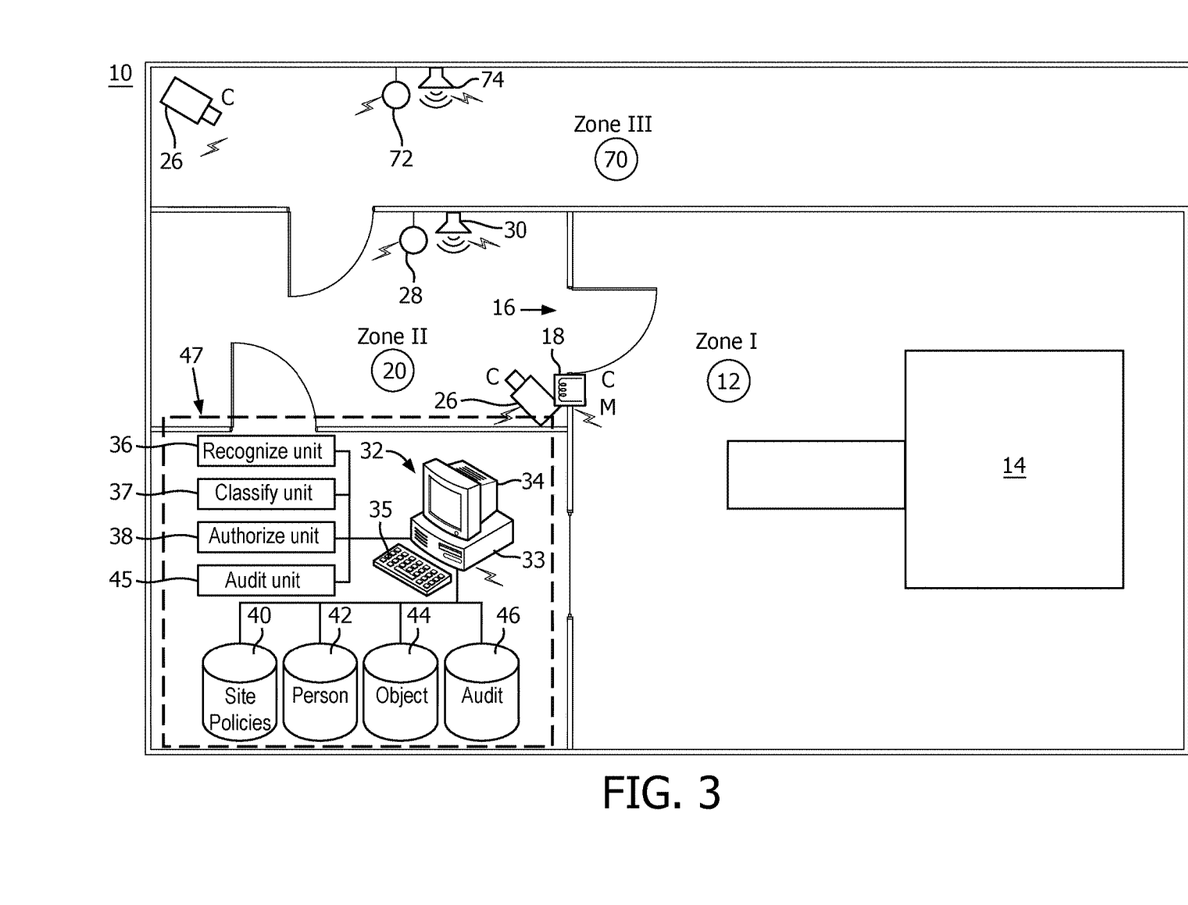
FIG. 3 schematically illustrates another embodiment of the video surveillance system for MRI safety monitoring with graduated surveillance.

With reference to FIG. 3, another embodiment of the video surveillance system 10 for MRI safety monitoring with graduated surveillance is schematically illustrated. The system 10 includes a multiple physical zones 20, 70 through which persons and objects flow when approaching the entrance 16 to the MR room. Each zone includes at least one video camera 26 positioned to view the flow of persons and objects through the zone toward the entrance 16. The recognize unit 36 receives the video of imaged persons and objects from each video camera in each zone. The classify unit 37 classifies the objects and persons in the corresponding zone and the authorize unit 38 determines access for each zone according to the local site policies. The site policies can be further differentiated to apply graduated access rules by zone. For example, an object classified as unsafe MR may receive access permitted with a warning in a more remote zone 70, while the same object access is denied in a next or closer zone 20. The more remote zone 70 may differentiate the indicators of the visual indicator 72 or audible indicator 74. For example, the visual indicator can be a basic sequence of three lights such as green, yellow, and red, and one of which is light depending on the authorized access analogous to a traffic signal. Audible indications may provide instructions and feedback in a voice message without alarms or alert sounds.

Figure 4:
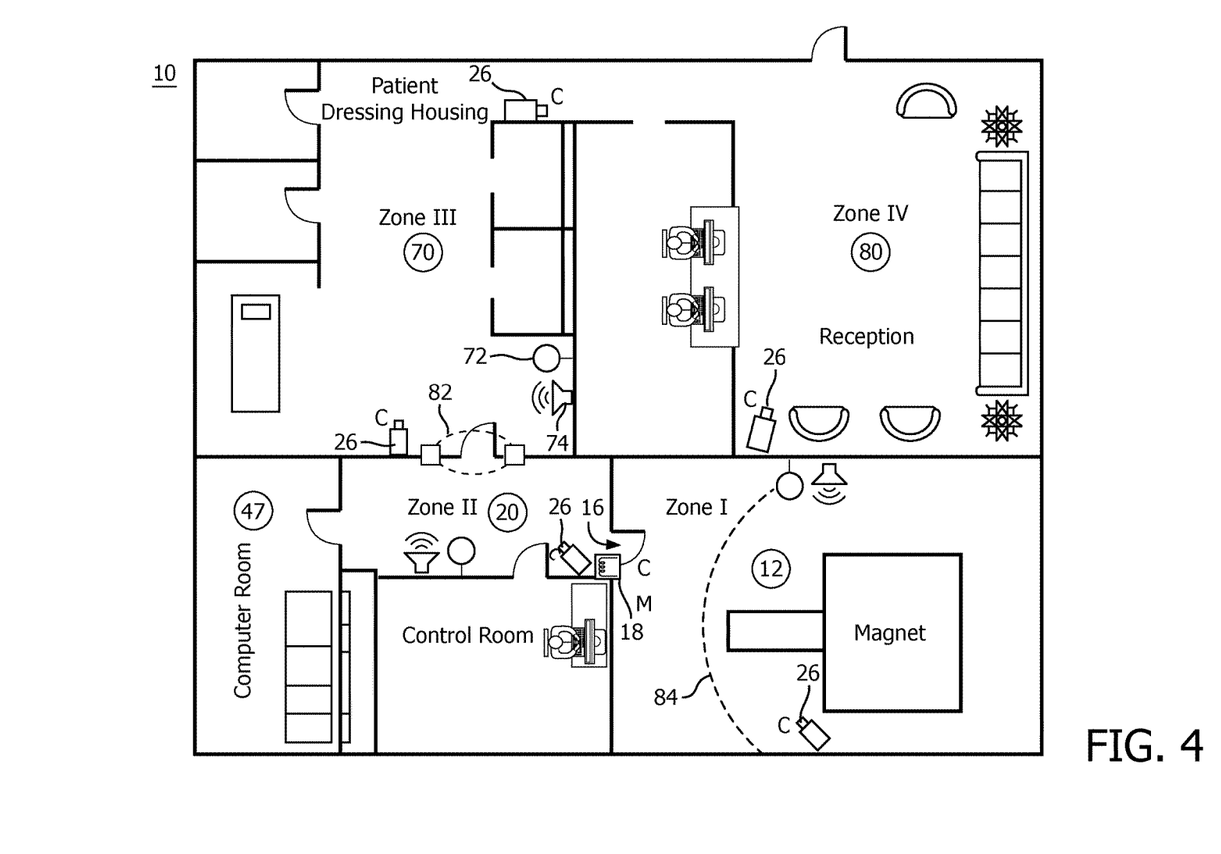
FIG. 4 schematically illustrates another embodiment of the video surveillance system for MRI safety monitoring with graduated surveillance in an ACR idealized MRI suite.

With reference to FIG. 4, another embodiment of the video surveillance system 10 for MRI safety monitoring with graduated surveillance in an ACR compliant MRI suite is schematically illustrated. The MRI suite includes 3 zones 80, 70, 20 through which patients flow toward the entrance 16 of the MR room and each includes the video camera which images persons and objects flowing through that zone. The configuration and presence of visual and/or audio indicators in each zone is site specific. The indicators can be different for each zone. The MR room is the fourth zone 12.

A first zone 80, most distal to the entrance of the MR room, can be configured as a reception area. The authorize unit 38 can send messages to a computer at the reception desk informing the receptionist of MR unsafe or unknown objects. Sounds can be sounded on the reception computer as the audio indicator to alert the receptionist that an unsafe MR object has entered the zone. The receptionist can visually inspect objects and/or persons and interact with the system to classify a person and/or object as MR safe. The system can visually track the person through each zone and reclassify the person and/or object based on behavior which deviates from normal such visiting a toilet, interacting with other staff, removing an object from a handbag, and the like.

In a next zone 70, more proximal to the entrance of the MR room, visual and/or audio indicators indicate the presence of MR unsafe objects to the persons flowing through the room. Multiple cameras 26 are present and advantageously placed at points to view traffic flow, preferably where narrowed. The visual indicator 72 and audio indicator 74 are placed to provide visibility and hearing by persons flowing through the zone. The zone can be configured for patient dressing and undressing, and storage. The zone provides the opportunity for persons to remove and/or leave behind MR unsafe objects. The cameras 26 can also provide security measures which are normally associated with video surveillance.

In a narrowed portion, such as an entrance, of the most proximal zone 20 to the MR room, the zone can include a ferrous metal detector (FMD) 82 which detects ferrous metals which pass through a scanned location. Placement of the FMD at the entrance to the zone provides time for persons to react. FMDs can be included in multiple locations. With reference to FIG. 1, the FMD can be included in the hallway 20 before the entrance 16. An MR attendant can also use a handheld FMD. The classify unit 37 receives a signal from the ferrous metal detector corresponding to the imaged object or person which passed through the scanned location indicative of detected ferrous metal. The signal can include a visual evaluation of the FMD's response when interacting with a person and/or object, or a physical or wireless connection to the FMD device to record its response. The classify unit evaluates the received signal from the ferrous metal detector to classify the imaged object or person which passed through the scanned location. The authorize unit can send message to an MR operator of unsafe object present in zone and deny access to the entrance 16 of the MR room with the electronic locking mechanism 18. Similar FMD zones can also be used in conjunction with the preceding or other embodiments to make the determination regarding which identified persons and objects are MRI safe. In one embodiment, patients, objects, and/or others are issued an MR safe badge by an FMD attendant in zone III 70.

The zones with indicators can be configured to provide a graduated surveillance. In the first zone, the surveillance includes a notice to the receptionist of the presence of the unsafe object. In the next zone, the surveillance includes direct notice to the persons. In a most proximal, the surveillance includes notice to the persons and to the MR operator. With each zone, access can be restricted through the use of electronic locking mechanisms. For example, multiple entrances can be configured with electronic locking mechanisms which gradually restrict access based on site policies, classified objects and classified persons, and signals from FMDs. For example, an unsafe MR object can be permitted in the reception zone, visually and/or audibly warned in a next zone, and denied access in the most proximal zone. All persons can be permitted in the reception zone, untrained persons warned in a next zone, and denied access or at least warned in a most proximal zone unless accompanied by a trained person.

Zones can be created with the MR room, such as the 5 gauss zone 84. Zones can be marked on the floor such as with red lines which identify a physical location within the MR room. Access can be granted into the MR room with the electronic locking mechanism and an audible indicator that an object is not to be taken past the line marked, such as the 5 gauss zone. Indicators can be included inside the MR room which monitor the zones within the MR room.

Figure 5:
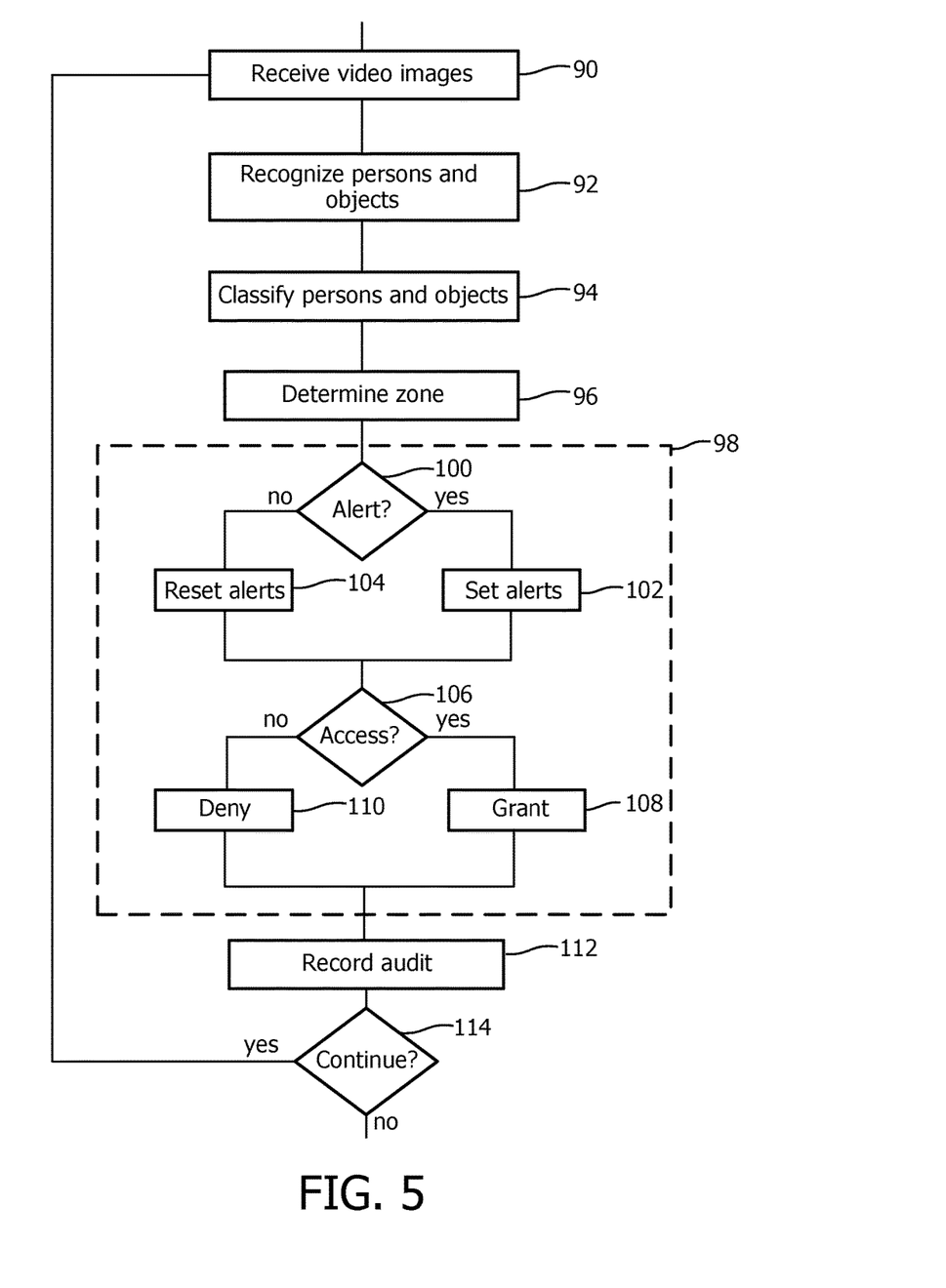
FIG. 5 flowcharts one method of using an embodiment of video surveillance for MRI safety monitoring.

FIG. 5 flowcharts one method of using an embodiment of video surveillance for MRI safety monitoring. In a step 90, video images of persons and objects approaching an entrance to a room containing a magnetic resonance imaging (MRI) device which includes a superconducting magnet and images subjects are received. The video images can be received from a plurality of video cameras. Receiving video images can be for a plurality of physical locations or zones.

Each imaged object and person is recognized in a step 92. Recognizing each person by the recognize unit 36 can include individual recognition, or a group member recognition, such as a trained persons group or an untrained persons group. Individual recognition can include identifying facial features, badge features, and the like. Group membership recognition can include identifying clothing or textiles, badges, symbols, and the like. Recognizing each object can include identifying the shape, size, texture, and the like. Recognizing objects include matching electronic images of objects approaching the MR room with reference images or image files stored in a data store. Recognizing objects can include recognizing labeling of objects.

Each recognized person and each recognized object is classified according to MRI safety in a step 94 by the classify unit 37. Recognized objects are associated with object classes and recognized persons are associated with person classes. Persons and objects can associated with subclasses of the classes. For example, a recognized person may be associated with the MR trained subclass based on the person group member recognized, e.g. uniform, badge, etc. The recognized person may be associated with the MR trained subclass based on the individual recognized, e.g. Joe White. Joe White can be classified based on a data store which indicates Joe White has been MR trained. The subclass trained can be included in the MR safe class.

A zone can be determined in a step 96, where multiple zones are employed. Site policies can determine access privileges and/or responses to MR unsafe and/or unknown objects or persons in individual zones.

In a series of steps 98, access to the room containing the MRI device or toward the entrance for multi-zone flow is determined based on each classified object and person by the authorize unit 38. The determined access can include receiving a signal from a ferrous metal detector corresponding to the imaged object or person indicative of detected ferrous metal which passed through a scanned location, and evaluating the received signal from the ferrous metal detector to classify the imaged object or person which passed through the scanned location. Determining access can include determining a distance and a direction of movement of classified objects and persons relative to the entrance or flow through the zone. Determining access can include evaluating a hierarchy of object classes and person classes associated with the classified objects and classified persons.

Determining access can include deciding whether to alert based on the classified persons and objects in the location monitored by the camera in a step 100. Separate decisions can be determined for each surveillance zone. Based on the decision, the authorize unit can communicate with one or more visual indicators to visually indicate an indication of the determined access in a step 102. The step can include communicating with one or more audio indicators to audibly indicate an indication of the determined access. The determined access can include indications of access permitted or MR safe, a warning or MR caution, access denied or MR unsafe, and the like based on the determined access for classified persons and objects. Alternatively to communicating with visual and/or audio indicators, the indicators can be reset in a step 104. The resetting of indicators can be a result of a change in persons and/or objects, or a reclassification based on recognition of labels or new recognitions. For example, an object may be classified as MR unsafe, but the person transporting the object turns the object to make the MR safe label visible to the surveillance camera. The system recognizes the label, reclassifies the object, determines the access to no longer display indicators of unsafe MR, or to display default indicators of MR safe as defined by the site policies.

The determined access can include authorizing physical access in a decision step 106. The decision can include determining access for each zone where physical access is controlled. In a step 108, the determined access grants access based on the classified persons and objects. The access is controlled by an electronic locking mechanism such as an electronic door lock. The access can include an intermediate control unit such as a building management and control system, which directly operates on the locking mechanism. Alternatively to granting access, access can be denied in a step 110. Granting or denying access is based on the classified persons and objects evaluated according to the site policies.

In a step 112, video frames or segments of persons and objects can be recorded for analysis and feedback. For example, video of objects can be stored which are classified as MRI unsafe in a corresponding distance to the entrance with persons simultaneously classified as MRI safe. Reviewing the different objects in the audit data store provides identification of problem objects. The future presence of problem objects can be reduced through communication in signage, literature, patient instructions, etc. The audit can include recognition and/or classification information to facilitate analysis.

It is to be appreciated that in connection with the particular illustrative embodiments presented herein certain structural and/or function features are described as being incorporated in defined elements and/or components. However, it is contemplated that these features may, to the same or similar benefit, also likewise be incorporated in other elements and/or components where appropriate. It is also to be appreciated that different aspects of the exemplary embodiments may be selectively employed as appropriate to achieve other alternate embodiments suited for desired applications, the other alternate embodiments thereby realizing the respective advantages of the aspects incorporated therein.

It is also to be appreciated that particular elements or components described herein may have their functionality suitably implemented via hardware, software, firmware or a combination thereof. Additionally, it is to be appreciated that certain elements described herein as incorporated together may under suitable circumstances be stand-alone elements or otherwise divided. Similarly, a plurality of particular functions described as being carried out by one particular element may be carried out by a plurality of distinct elements acting independently to carry out individual functions, or certain individual functions may be split-up and carried out by a plurality of distinct elements acting in concert. Alternately, some elements or components otherwise described and/or shown herein as distinct from one another may be physically or functionally combined where appropriate.

In short, the present specification has been set forth with reference to preferred embodiments. Obviously, modifications and alterations will occur to others upon reading and understanding the present specification. It is intended that the invention be construed as including all such modifications and alterations insofar as they come within the scope of the appended claims or the equivalents thereof. That is to say, it will be appreciated that various of the above-disclosed and other features and functions, or alternatives thereof, may be desirably combined into many other different systems or applications, and also that various presently unforeseen or unanticipated alternatives, modifications, variations or improvements therein may be subsequently made by those skilled in the art which are similarly intended to be encompassed by the following claims.

The invention claimed is:

1. A magnetic resonance imaging (MRI) location surveillance system for limiting access by objects and/or persons to an MR room containing an MRI device, which includes a main magnet, the surveillance system comprising:
   multiple physical zones through which objects and persons flow when approaching the entrance to the MR room, each physical zone including at least one video camera positioned to view the flow of objects and persons through the physical zone toward the entrance of the MR room in order to obtain images of objects and/or persons approaching the entrance, such that each imaged object and each imaged person is tracked through each physical zone, wherein the multiple physical zones include a first zone most distal to the entrance, a next zone more proximal to the entrance and a narrowed most proximal zone at the entrance,
   a recognize unit in communication with each of the at least one video camera included in each physical zone, the recognize unit receiving the images of the objects and/or persons, and recognizing each imaged object and each imaged person;
   a classify unit which classifies each recognized object and/or each recognized person according to MRI safety, and reclassifies each recognized person based on behavior;
   an authorize unit which determines access to the MR room based on each classified object and/or each classified person based on the classification, and determines configurations of visual and/or audio indicators in the next zone that indicate the presence of MR unsafe classified objects and/or classified persons flowing through the next zone to prevent entry of the MR unsafe classified objects and/or classified persons into the MR room; and
   at least one ferrous metal detector in a scanned location at an entrance of the narrowed most proximal zone which detects ferrous metals that pass through the scanned location, wherein the classify unit receives a signal from the ferrous metal detector, corresponding to an imaged object and/or person which passed through the scanned location, indicating a detected ferrous metal, and evaluates the received signal from the ferrous metal detector to classify the imaged object and/or person which passed through the scanned location.

2. The system according to claim 1, wherein the recognition unit recognizes labeling located on each recognized object and/or each recognized person.

3. The system according to claim 1, wherein the authorize unit determines access based on a determination of distance and direction of movement of classified objects and classified persons relative to the entrance.

4. The system according to claim 3, further including:
a data store of site policies which defines a hierarchy of object classes and person classes and corresponding access privileges;
wherein the classify unit associates classified objects with object classes and classified persons with person classes retrieved from the data store of site policies; and
wherein the authorize unit determines access based on an evaluation of the hierarchy of associated objects and persons and the corresponding access privileges.

5. The system according to claim 1, wherein the recognition unit recognizes and identifies persons based on at least one of the group consisting of facial recognition, clothing recognition, badge recognition, symbol recognition; and
wherein the classify unit classifies persons as magnetic resonance safety trained persons based on matches with magnetic resonance safety trained persons retrieved from a data store.

6. The system according to claim 1, wherein the authorize unit orders the images of persons approaching the entrance according to a distance to the entrance of the room, determines a distance between persons differently classified, and determines access based on the order and the determined distance.

7. The system according to claim 1, further comprising an audit unit which stores in a data store the video of objects classified as MRI unsafe in a corresponding distance to the entrance with persons simultaneously classified as MRI safe.

8. A method of video surveillance of an entrance to an MR room containing a magnetic resonance imaging (MRI) device that includes a main magnet, wherein objects and persons flow through multiple physical zones when approaching the entrance, and each physical zone includes at least one video camera positioned to view the flow of objects and persons through the physical zone toward the entrance, the multiple physical zones including a first zone most distal to the entrance, a next zone more proximal to the entrance and a narrowed most proximal zone at the entrance, the method comprising:
receiving from the at least one video camera video images of the objects and persons in the multiple physical zones approaching the entrance to the room, such that each imaged object and each imaged person is tracked through each physical zone;
recognizing each imaged object and/or each imaged person;
classifying each recognized object and/or each recognized person according to MRI safety, and reclassifying each recognized person based on behavior;
determining access to the MR room containing the MRI device based on each classified object and/or each classified person based on the classification, with visual and/or audio indicators in the next zone indicating the presence of MR unsafe objects and/or persons flowing through the next zone to prevent entry into the MR room; and
detecting ferrous metals which pass through a scanned location by at least one ferrous metal detector at an entrance of the narrowed most proximal zone, wherein classifying each recognized object and/or each recognized person includes receiving a signal from the ferrous metal detector corresponding to the imaged object or person which passed through the scanned location, indicating a detected ferrous metal, and evaluating the received signal from the ferrous metal detector to classify the imaged object or person which passed through the scanned location.

9. The method according to claim 8, wherein recognizing comprises recognizing labeling located on each recognized object and/or person.

10. The method according to claim 8, wherein determining access comprises determining a distance and a direction of movement of classified objects and persons relative to the entrance.

11. The method according to claim 8, wherein determining access comprises:
associating classified objects with object classes and classified persons with person classes;
evaluating a hierarchy of object classes and person classes associated with the classified objects and classified persons; and
determining access based on the evaluated hierarchy.

12. The system according to claim 1, wherein the authorize unit is configured to provide graduated access based on access rules to the multiple physical zones.

13. A magnetic resonance imaging (MRI) location surveillance system for limiting access by objects and/or persons to an MR room containing an MRI device, which includes a main magnet, the surveillance system comprising:
multiple physical zones through which objects and persons flow when approaching the entrance to the MR room, each physical zone including at least one video camera positioned to view the flow of objects and persons through the physical zone toward the entrance of the MR room in order to obtain images of objects and/or persons approaching the entrance, such that each imaged object and each imaged person is tracked through each physical zone, wherein the multiple physical zones include a first zone most distal to the entrance, a next zone more proximal to the entrance and a narrowed most proximal zone at the entrance;
at least one ferrous metal detector in a scanned location at an entrance of the narrowed most proximal zone which detects ferrous metals that pass through the scanned location; and
a computer programmed to execute a software program, stored on non-transitory computer readable medium, the computer being in communication with the at least one video camera included in each physical zone and the at least one ferrous metal detector, the software program comprising:
a recognize unit receiving the images of the objects and/or persons, and recognizing each imaged object and each imaged person;
a classify unit classifying each recognized object and/or each recognized person according to MRI safety, and reclassifying each recognized person based on behavior, and further receiving a signal from the ferrous metal detector, corresponding to an imaged object and/or person which passed through the scanned location, indicating a detected ferrous metal, and evaluating the received signal from the ferrous metal detector to in classifying the imaged object and/or person which passed through the scanned location; and
an authorize unit determining access to the MR room based on each classified object and/or each classified person based on the classification, and determining configurations of visual and/or audio indicators in the next zone that indicate the presence of MR unsafe classified objects and/or classified persons flowing through the next zone to prevent entry of the MR unsafe classified objects and/or classified persons into the MR room.

* * * * *